United States Patent [19]

Cline et al.

[11] 4,170,491

[45] Oct. 9, 1979

[54] NEAR-SURFACE THERMAL GRADIENT ENHANCEMENT WITH OPAQUE COATINGS

[75] Inventors: Harvey E. Cline, Schenectady; Douglas E. Houston, Ballston Lake; Thomas R. Anthony, Schenectady, all of N.Y.

[73] Assignee: General Electric Company, Schenectady, N.Y.

[21] Appl. No.: 967,280

[22] Filed: Dec. 7, 1978

[51] Int. Cl.[2] .......................................... H01L 21/225
[52] U.S. Cl. .................................... 148/1.5; 148/177; 148/187
[58] Field of Search ..................... 148/1.5, 177, 187

[56] References Cited

U.S. PATENT DOCUMENTS

| 2,739,088 | 3/1956 | Pfann | 75/65 ZM |
|---|---|---|---|
| 2,813,048 | 11/1957 | Pfann | 148/1.5 |
| 3,897,277 | 7/1975 | Blumenfeld | 148/186 X |
| 3,898,106 | 8/1975 | Cline et al. | 148/188 X |
| 3,899,362 | 8/1975 | Cline et al. | 148/1.5 |
| 3,901,736 | 8/1975 | Anthony et al. | 148/188 X |
| 3,902,925 | 9/1975 | Anthony et al. | 148/188 X |
| 3,904,442 | 9/1975 | Anthony et al. | 148/188 X |
| 4,006,040 | 2/1977 | Cline et al. | 148/1.5 |
| 4,091,257 | 5/1978 | Anthony et al. | 148/171 X |

*Primary Examiner*—G. Ozaki
*Attorney, Agent, or Firm*—Donald M. Winegar; Joseph T. Cohen; Leo I. MaLossi

[57] ABSTRACT

A thin opaque layer of material is deposited on one or both major opposed surfaces of a semiconductor wafer to enhance establishing a thermal gradient near the major surface or surfaces to produce straight, fine molten wires (<0.002") of a metal by migration of a melt of the metal through a solid, or matrix, both of semiconductor material by thermal gradient zone melting processing along a thermal gradient established and maintained aligned substantially parallel with a preferred crystal axis of migration by thermal gradient zone melting processing.

10 Claims, No Drawings

NEAR-SURFACE THERMAL GRADIENT ENHANCEMENT WITH OPAQUE COATINGS

BACKGROUND OF THE INVENTION

1. Field of the Invention

This invention relates to a method of migrating a melt of a metal through a solid body of semiconductor material by thermal gradient zone melting (TGZM) and, in particular, to the uniform initiation of migration by enhancing the penetration of melts into the material at the surface where fine liquid wires are being migrated by minimizing the near-surface reduction in the thermal gradient.

2. Description of the Prior Art

W. G. Pfann in U.S. Pat. Nos. 2,813,048 and 2,739,088 describes methods for practicing the movement of melts of metal through particular regions of a solid body of semiconductor material by thermal gradient zone melting. However, molten line and droplet instability resulted in the breakup of the migrating lines and droplets and consequently acceptable semiconductor devices were not always obtainable.

Recently, Thomas R. Anthony and Harvey E. Cline discovered that preferred planar orientations of the surfaces of the body of semiconductor material, migration axis and line orientation axis relationships were also a necessity to migrate liquid metal wires and/or droplets through the solid body (See U.S. Pat. Nos. 3,899,362 and 3,904,442, for example). These improvements in TGZM resulted in commercialization of the process. However, as the width of the lines being migrated becomes smaller, the penetration of fine liquid lines of less than 2 mils in width, and preferably 1 mil in width, and small liquid droplets, less than 6 mils in diameter, from the surface of a wafer or body of semiconductor material has been difficult to achieve repeatedly on a commercial basis by a thermal gradient alone. Although a thermal gradient is strong enough to cause migration of the small liquid zones once they are formed in the bulk of semiconductor material, the thermal gradient force is not powerful enough to overcome the surface tension forces holding fine liquid zones, or wires, on the surface of a body, or wafer. Despite further improvements to the TGZM processing techniques, including alloying the deposited metal to the surface (U.S. Pat. No. 3,897,277) and sintering of the same (U.S. Pat. No. 4,006,040), the problem still persists as one attempts to migrate fine wires on a commercial basis. As a result, TGZM to date has been limited to line dimensions typical of isolation grids in solid state power devices and has not had any commercial impact on integrated-circuit type devices which require much finer doped region geometries.

Further studies of the problem indicate that a thermal gradient near the surface of a body of semiconductor material is considerably reduced from its value in the bulk material. This is attributed to the partial infrared transparency of the material of the body or wafer. This near-surface reduction in thermal gradient near the cold entrance surface of a wafer of semiconductor material causes liquid zone penetration to become more difficult and may even prevent, completely, penetration of liquid zones or melts less than a critical size.

In a similar manner, a reduction in the thermal gradient near the hot exit surface of a wafer of semiconductor material undergoing thermal gradient zone melting processing prevents the liquid zone or migrating melt from exiting from the solid body. It has been observed in such instances that the melt will migrate through the bulk of the solid material of a silicon wafer of 10 mil thickness and then come to rest at a distance of ½ to 1 mil from the exit surface. After a time, the melt may, and often does, break through the exit surface but the time at rest causes a widening of the melt in the region of rest.

A means of eliminating such near-surface gradient effects is to heavily dope the wafer of semiconductor material in the affected near-surface regions to a depth of from 1 to 25 microns depending on the solubility of the dopant migrating material. Although this dopant method prevents the fall-off in the thermal gradient near the surfaces of the wafer, it requires extra diffusion steps and an extra lapping step. This remedy is applicable generally when thermal migration is one of the first process steps. In addition, the heavy doping of the near-surface regions of the wafer induces both dislocation formation and stress in the wafer.

An object of this invention is to provide a method for minimizing the reduction in the thermal gradient near the major opposed surfaces of a body of semiconductor material.

Another object of this invention is to provide a thin opaque layer of a suitable material on one or both major surfaces of body of semiconductor material in order to enhance the retaining of a thermal gradient in the near surface region.

Other objects of this invention will, in part, be obvious and will, in part, appear hereinafter.

BRIEF DESCRIPTION OF THE INVENTION

In accordance with the teachings of this invention, there is provided a new and improved method for migrating a melt of metal-rich semiconductor material through a solid body of the semiconductor material by temperature gradient zone melting (TGZM). A source of radiant energy such as infrared lamps is generally employed in practicing TGZM. A layer of a material such, for example, as tungsten, molybdenum, aluminum, gold and the like is deposited on at least the surface of initiation of the melt for migration. The thickness of the layer is sufficient to make it opaque to the radiant energy emitted by the body. The opaque layer minimizes the reduction in the thermal gradient previously noted as occurring in the near-surface region which gives rise to melt initiation, particularly when fine lines (2 mils or less in width) and dots or discs (6 mils in diameter) are being migrated. The layer need only be a minimum $\sim 300$ Å in thickness.

The opaque layer of material may (1) be deposited on the surface of the body and the metal to be migrated deposited in windows formed therein, (2) be deposited on the surface and the metal to be migrated deposited directly on the opaque layer, or (3) be deposited on top of the metal to be migrated.

A second opaque layer of material may be deposited on the major surface of the body closest to the source of radiant energy. The second layer has a thickness sufficient to make it opaque to the radiant energy emitted by the radiant energy source. The second opaque layer minimizes the reduction in the thermal gradient in that near-surface region of the body. The material of the second layer can be any of the same materials comprising the first layer. Both opaque layers can be deposited simultaneously.

Suitable means for depositing the opaque layers are electron beam evaporation, chemical vapor deposition, and sputtering. Both opaque layers prefereably showed minimum reflective capabilities. Tungsten is a preferred material for both opaque layers when the semiconductor material is silicon.

DESCRIPTION OF THE INVENTION

A body of semiconductor material is selected for a particular level of resistivity and a first type conductivity. The body has opposed major surfaces which are the top and bottom surfaces, respectively, thereof. The semiconductor material comprising the body may be silicon, germanium, silicon carbide, gallium arsenide, a compound of a Group II element and a Group VI element, and a compound of a Group III element and a Group V element.

The thermal migration of metal wires is preferably practiced in accordance with the planar orientations, thermal migration directions, stable wire directions and stable wire sizes of the following Table:

TABLE

| Wafer Plane | Migration Direction | Stable Wire Directions | Stable Wire Sizes |
|---|---|---|---|
| (100) | <100> | <01$\bar{1}$>* | <100 microns |
|  |  | <0$\bar{1}$1>or <01$\bar{1}$> | <100 microns |
| (110) | <110> | <1$\bar{1}$0>* | <150 microns |
| (111) | <111> | (a) <01$\bar{1}$> |  |
|  |  | <$\bar{1}$01> | <500 microns |
|  |  | <1$\bar{1}$0> |  |
|  |  | (b) <11$\bar{2}$>* |  |
|  |  | <$\bar{2}$11> | <500 microns |
|  |  | <1$\bar{2}$1> |  |
|  |  | (c) Any other* direction in (111) plane | 500 microns |

*The stability of the migrating wire is sensitive to the alignment of the thermal gradient with the <100>, <110> and <111> axis, respectively. Group a is more stable than group b which is more stable than group c.

The temperature gradient zone melting process and apparatus is not a part of this invention. For a more thorough understanding of the temperature gradient zone melting process employed in this invention and for a more thorough description of the apparatus employed for this process, one is directed to the following U.S. Patents entitled "Method of Making Deep Diodes", U.S. Pat. No. 3,901,736; "Deep Diode Device and Method", U.S. Pat. No. 3,902,925; "Deep Diode Devices and Method and Apparatus", U.S. Pat. No. 4,091,257; "High Velocity Thermomigration Method of Making Deep Diodes", U.S. Pat. No. 3,898,106; "Deep Diode Device and Method", U.S. Pat. No. 3,902,925; "Stabilized Droplet Method of Making Deep Diodes Having Uniform Electrical Properties", U.S. Pat. No. 3,899,361; "Method of Making Isolation Grids in Bodies of Semiconductor Material", U.S. Pat. No. 3,979,320; and "Thermomigration of Metal-Rich Liquid Wires Through Semiconductor Materials", U.S. Pat. No. 3,899,362.

We have discovered that a thin opaque layer of a material deposited on one or both major surfaces of a body of semiconductor material will minimize the near-surface reduction in a thermal gradient established in the body. By the word "opaque" we mean that the thickness of the layer of material on the major surface nearest the source of radiant energy for practicing thermal gradiant zone melting is sufficient to make it impervious to visible light and the radiant energy of the source. The thickness of the layer of the material on the major surface furthest from the radiant energy source, that is, the surface upon which the metal to be migrated is deposited, is sufficient to be impervious to the radiant energy emitted by the body of semiconductor material. The material has a high melting temperature and should not degrade the electrical properties of the semiconductor material because of its presence on the wafer or body surface. A high temperature melting material is desirable to prevent "balling up" of the layer and exposure of the major surface, thereby defeating the purpose of the opaque layer. Also, if one was to practice TGZM in a silicon wafer which required a high minority carrier lifetime, one should not employ a thin opaque layer of gold or other lifetime killing metals such as silver, platinum, nickel, copper and the like. Further, the material should be one that does not interfere with TGZM processing nor cause significant thermal stresses during heating and cooling of the wafer or body. Additionally, the material should not be capable of forming an alloy or an intermetallic compound that can not be removed from the wafer. One could accomplish this by employing a close match between the coefficient of thermal expansion of the semiconductor material and that of the metal layer. Suitable materials include tungsten, molybdenum, aluminum, tantalum, titanium and the like.

For purposes of illustration only, the wafer or body of semiconductor material is considered to be of silicon, the most common material with which TGZM is practiced.

Since most radiation sources of energy are not monochromatic sources of radiation, we have found that the wave-length that one must use to determine the thickness of the material of the opaque layer which functions to concentrate radiation from the source to heat the near-surface portions of the body is the wavelength of the most intense portion of the incident radiation spectrum. For example, utilizing GE 3200T 3/1CL Quartz Infrared Lamps available from the General Electric Company as radiation sources with a filament temperature of 2893° Kelvin, one finds that the most intense portion of the radiation spectrum is centered about a wavelength of one micron in vacuum. The passage of the radiation through the body causes the wavelength of the radiation to increase in accordance with the temperature at which migration is practiced. The body is at this temperature of migration. The wavelength in vacuum of the most intense radiation reradiated from the semiconductor body through the surface during the practice of thermal migration is given in the Table for various processing temperatures of body when the material thereof is silicon.

TABLE

| Temperature in °C. of Wafer | Wavelength in microns of Reradiated Radiation from Wafer |
|---|---|
| 1400 | 1.73 |
| 1350 | 1.78 |
| 1300 | 1.84 |
| 1250 | 1.89 |
| 1200 | 1.96 |
| 1150 | 2.02 |
| 1100 | 2.11 |
| 1050 | 2.18 |
| 1000 | 2.27 |
| 950 | 2.36 |
| 900 | 2.45 |
| 950 | 2.55 |
| 800 | 2.68 |

Therefore, the thickness of the opaque layer on the major surface furthest from the radiant energy source, and also the surface of melt initiation, is not the same thickness as that on the major surface closest to the radiant energy source. However, since the opaque layer is thicker closest to the energy source, one can deposit both layers simultaneously without affecting the unidirectional thermal gradient to be established in the body Sputtering, electron beam and chemical vapor deposition are suitable means for forming the opaque layers on the major opposed surfaces of the body. Preferably sputtering and electron beam deposition are practiced since high deposition rates can be achieved and the resulting layers above a rough surface. One should not deposit the material of the opaque layer in a manner that will produce high reflectivity as this will create inefficiency in heating the body of semiconductor material. Even if some oxygen be trapped in the sputtered or electron beam deposited material, TGZM processing will not be interfered with and doping levels will not be appreciably affected.

An opaque layer deposited on only the surface closest to the source of radiant energy effectively produces an opaque body and a minimizing of the reduction of the thermal gradient in the near-surface region. However, a reduction in the thermal gradient will still occur in the near-surface region for the surface of melt initiation and/or penetration. Therefore, the second surface is also coated with the opaque layer. The result is that the coated body or wafer is now substantially an opaque body as seen by the radiant energy source.

A preferred material for forming the opaque layer is tungsten. Tungsten has a good match of coefficient of thermal expansion with that of silicon. A layer of only about 300 Å thickness is needed to achieve opaqueness for the surface closest to the radiant energy source. Tungsten does not interfere with TGZM processing and has no detrimental affect on the electrical characteristics of the silicon material. Tungsten is readily deposited by either chemical vapor deposition, sputtering or by electron beam evaporation. Further, a thin layer, ~200 Å, is easily removable from the wafer or body by simple dipping in a solution of 30% $H_2O_2$. The layer of tungsten may either be deposited directly onto the surfaces of the wafer or body before deposition of the array of metal discs and/or metal lines to be migrated or it may be deposited directly onto both the surfaces of the wafer or body and the metal to be migrated.

When the tungsten or other suitable material is deposited on surface of melt initiation, it may be patterned by photolithographical means to open windows therein for deposition of the metal to be migrated. Alternatively, the metal to be migrated can be deposited directly on the opaque layer, patterned by photolithographical means to form the array of migration. The melt of metal-rich semiconductor material is formed and includes a small amount of the opaque layer material. Migration through the wafer or body produces a recrystallized semiconductor material of the body or wafer having the solubility limit of the dopant metal impurity and the opaque layer material therein as determined by the temperature of the migration. The amount of opaque layer material present in the recrystallized material is not too significant, but if it is a lifetime controlling material such as gold, platinum, silicon, nickel, copper and the like, the effect on the minority carrier lifetime characteristic of the material could preclude their use for forming the opaque layer. Furthermore, gold should not be used with aluminum because of the occurrence of the "purple plague".

Aluminum, as well as molybdenum, may also be used in an opaque layer material as an alternative to the tungsten. The thickness of the aluminum required is only ~300 Å. Therefore, when the wafer is heated to a temperature to form the melt and to initiate migration, the thin layer of aluminum on the naturally occurring semiconductor oxide, about 1000 Å thick, does not ball up producing a non-uniform layer and does not penetrate into the body and migrate. The aluminum on top of the aluminum or other dopant impurity metal to be migrated naturally oxidizes and does not become part of the metal-rich semiconductor material and is migrated in that area only where the dopant metal has been deposited. With a naturally occurring aluminum oxide layer, a thin aluminum layer of from 600 Å to ~100 Å will not ball up or migrate through the semiconductor oxide of the wafer even at temperatures of up to the order of 1200° C. to 1400° C.

Employment of the opaque layer of material enhances melt formation and penetration thereby providing another excellent process means for migrating arrays of fine lines and/or dots or discs. This improvement in processing can be combined with other process steps, such as off-axis migration of fine lines and/or discs or dots.

Therefore, by applying the principles of employing 220 to 10° off-axis material we were able to reproducibly form aluminum-doped regions of recrystallized silicon semiconductor material of 2 mil width and less. The thermal gradient is established and maintained as a unidirectional thermal gradient in the solid, or matrix body in a direction from 2° to 10° off the <100> axis of the matrix body crystal toward a direction selected from the group consisting of the <010> and the <001> directions. For example, we migrated 2 mil wide aluminum wires through silicon wafers cut 4°±0.5° off the <100> crystal axis of migration. The crystal axis of <011> direction was utilized as the axis of rotation. The thermal gradient was directed perpendicular to the opposed major surfaces of the wafers and resulted in an off-axis component in the <01$\bar{1}$> direction. The metal was deposited on the wafer surfaces parallel to the <011> crystal axis direction.

Preferably, the unidirectional thermal gradient is maintained within 2° to 10° off the preferred crystal axis of migration for the stable wire directions. The greater the component of off-axis migration becomes, provided it is not in the same crystal plane as the stable wire, the greater the tendency is for the migrating line to become unstable during migration although uniformity of melt penetration is achieved.

There is one exception, however. Stable metal wires of aluminum have been migrated through silicon wafers having a planar orientation of (111), stable wire directions of <1$\bar{1}$2>, <$\bar{2}$11>, and <1$\bar{2}$1>, and an off-axis component of up to 50°. This cannot be done with the other stable wire directions for (111) wafers.

In summation, tungsten, molybdenum and tantalum are the preferred metals which enhance the thermal gradient in the near surface region. In addition, titanium, from ~300 Å to ~1000 Å in thickness, and aluminum form a good opaque layer for practicing TGZM. Gold can also be employed as the opaque layer, but is temperature limited. A layer of gold which may be 1 micron or less in thickness on an oxide layer of the semiconductor material of the wafer functions well as an opaque layer to enhance the thermal gradient in near surface regions at temperatures of ≦800° C. A minimum amount of gold solid state diffusion occurs through the oxide layer and the surface region affected is easily removed by etching in aqua regia.

We claim as our invention:

1. In the method of moving a melt of metal-rich semiconductor material through a solid body of semiconductor material by thermal gradient zone melting processing comprising the steps of
   (a) selecting a body of single crystal semiconductor material so that the body has a first type conductivity, a selected resistivity, and at least one major surface having a preferred planar crystal structure orientation which is one selected from the group consisting of (100), (110) and (111), the vertical axis of the body being substantially aligned with a first axis of the crystal structure;
   (b) preparing the surface having the preferred planar crystal structure orientation to accommodate one or more physical configurations of a layer of metal thereon;
   (c) depositing an array of a first metal on the surface of the body of semiconductor material having the preferred planar crystal structure orientation, the metal of the array having a preferred geometric configuration;
   (d) heating the body and the first metal by a source of radiant energy to a temperature sufficient to form a melt of metal-rich material on the surface of the body;
   (e) establishing a unidirectional temperature gradient along substantially the vertical axis of the body and the first axis of the crystal structure;
   (f) migrating the metal-rich melt through the body along the first axis of the crystal structure to divide the body into a plurality of regions of first type conductivity and to form at least one or more regions of recrystallized material of the body having solid solubility of the vapor deposited metal therein, the first metal including at least one dopant impurity material therein to impart a second type conductivity and a selected level of resistivity thereto, the improvement in the method of
   depositing a first layer of a material on at least the major surface having the preferred planar crystal orientation, the layer being of a sufficient thickness to make it opaque to the radiant energy emitted by the body of semiconductor material.

2. The improved method of claim 1 and further including
   depositing a second layer of a material on the other of the two opposed major surfaces, the second layer being of a sufficient thickness to make it opaque to the radiant energy emitted by the source utilized for practicing the thermal gradient zone migration process.

3. The improved method of claim 1 and further including
   opening windiws in first layer of material, and
   depositing the array of first metal in the windows of the first layer of material.

4. The improved method of claim 1 or 2 wherein
   the array of metal is deposited on the first layer of material.

5. The improved method of claim 1 or 2 wherein
   the first layer of material is deposited on the array of metal to be migrated through the solid body.

6. The improved method of claim 1 or 2 wherein
   the material of the first and second layers is one selected from the group consisting of tungsten, molybdenum, tantalum and gold.

7. The improved method of claim 6, wherein
   the thickness of each of the first and second layers of material is ∼300 Å.

8. The improved method of claim 6, wherein
   the material of the first and second layers is tungsten.

9. The improved method of claim 1 or 2 including
   establishing and maintaining the unidirectional thermal gradient at from 2° to 10° off-axis of the normally preferred axis of thermal migration.

10. The improved method of claim 1 or 2 wherein
    the material of the first and second layers is one selected from the group consisting of aluminum and titanium.

* * * * *